United States Patent [19]

Ozawa

[11] Patent Number: 4,620,116
[45] Date of Patent: Oct. 28, 1986

[54] DECODER CIRCUIT WITH SETTING FUNCTION OF AN OUTPUT LEVEL

[75] Inventor: Takashi Ozawa, Tokyo, Japan

[73] Assignee: NEC Corporation, Tokyo, Japan

[21] Appl. No.: 545,293

[22] Filed: Oct. 25, 1983

[30] Foreign Application Priority Data

Oct. 27, 1982 [JP] Japan .................... 57-188711

[51] Int. Cl.$^4$ .......................... H03K 19/094
[52] U.S. Cl. ........................ 307/449; 307/443; 307/453; 307/463
[58] Field of Search ............ 307/443, 448, 449, 453, 307/463, 481, 269; 365/193, 233

[56] References Cited

U.S. PATENT DOCUMENTS

| | | | |
|---|---|---|---|
| 3,706,975 | 12/1972 | Paluck | 307/449 X |
| 4,021,781 | 5/1977 | Caudel | 307/453 X |
| 4,185,321 | 1/1980 | Iwahashi et al. | 307/449 X |
| 4,275,312 | 6/1981 | Saitou et al. | 307/449 X |
| 4,503,341 | 3/1985 | Shah | 307/448 X |

OTHER PUBLICATIONS

Dockerty et al, "Enhancement/Depletion Decoder Circuit", IBM Tech. Disc. Bull., vol. 19, No. 5, Oct. 1976, pp. 1681–1682.

*Primary Examiner*—Stanley D. Miller
*Assistant Examiner*—D. R. Hudspeth
*Attorney, Agent, or Firm*—Sughrue, Mion, Zinn, Macpeak & Seas

[57] ABSTRACT

A decoder circuit for use in a semiconductor member device or the like as a first metal insulator semiconductor field effect transistor (MISFET) acting as a load element, a plurality of parallel-connected MISFETs controlled by the output signals of an address buffer circuit serving as driver signals. Another MISFET is connected between the first MISFET and the parallel-connected MISFETS having a control signal applied to its gate. An output is taken from the junction between the first MISFET and the MISFET connected between the first MISFET and parallel-connected MISFETs. The decoder can generate an output signal regardless of the logic states of the input signals thereto.

4 Claims, 3 Drawing Figures

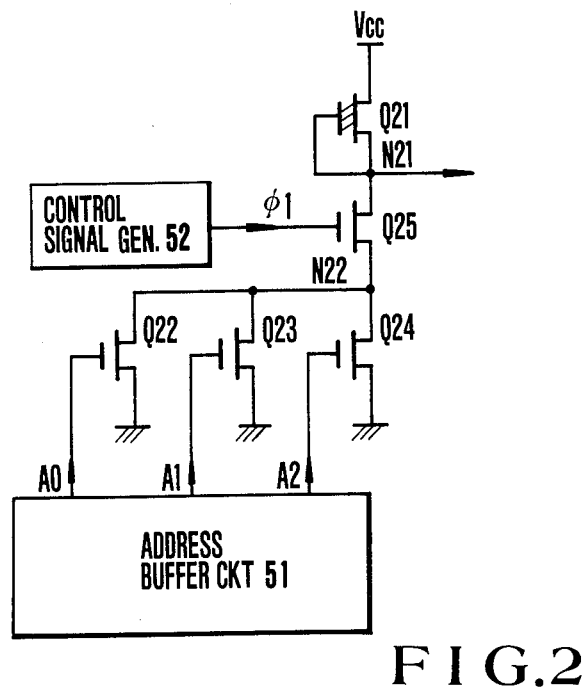
F I G. 2

DECODER CIRCUIT WITH SETTING FUNCTION OF AN OUTPUT LEVEL

BACKGROUND OF THE INVENTION

This invention relates to a decoder circuit for use in a semiconductor memory device or the like.

Conventionally, the output of a decoder circuit is controlled by inputting thereto output logic signals of an address buffer circuit. FIG. 1 illustrates one example of a prior art decoder circuit which is constituted by a metal insulator semiconductor field effect transistor (MISFET) Q11 acting as a load and three MISFETs Q12, Q13 and Q14 in parallel connection acting as drivers. The MISFET Q11 is of the depletion type with its drain terminal connected to a power supply Vcc and its gate and source terminals connected in common to a junction N11 leading to an output terminal. The MISFETs Q12, Q13 and Q14 are of the enhancement type. Their drain terminals are connected in common to the junction N11, and source terminals are all connected to ground GND while gate terminals are connected to receive input logic signals A0, A1 and A2, respectively, from an address buffer circuit. For simplicity of description, the decoder shown in FIG. 1 comprises only three MISFETs Q12, Q13 and Q14 acting as drivers, but it should be understood that the number of driver MISFETs may be larger than 3 or equal to two. Furthermore, for the purpose of simplifying the following description, all the MISFETs are of the N-channel type.

The operation of the decoder shown in FIG. 1 will now be described. When at least one of the input logic signals A0 to A2 is at a high level, one of the MISFETs Q12 to Q14 receiving the high level input signal becomes conductive so that the potential at the junction N11 becomes low, whereby the decoder circuit assumes a non-selective state. When all the input signals A0 to A2 are at a low level, all the MISFETs Q12 to Q14 become non-conductive so that the potential at the junction N11 becomes high. Thus, the decoder circuit assumes logic states depending upon the states of the input signals A0 to A2.

In the past, such decoder circuits are connected to respective word lines and selection lines for digit lines of a memory as X-decoders or Y-decoders, respectively, and one of the X-decoders and one of the Y-decoders are energized to select one of the word lines and one of the digit lines, respectively. With such a conventional scheme, however, the field of application of the decoder circuit is inconveniently limited since a plurality of memory cells cannot be selected simultaneously.

SUMMARY OF THE INVENTION

Accordingly, it is an object of this invention to provide an improved decoder circuit which can generate an output signal irrespective of the logic states of the input signals thereto.

It is another object of this invention to provide an improved circuit which can select a plurality of word lines at a time.

According to this invention, there is provided a decoder circuit comprising a first metal insulator semiconductor field effect transistor (MISFET) acting as a load element, a plurality of second MISFETs in parallel connection controlled by output signals of an address buffer circuit to act as drivers, a third MISFET connected between the first MISFET and the second MISFETs, and means for applying a control signal to the gate terminal of the third MISFET for turning ON and OFF the same, a junction between the first and third MISFETs constituting an output terminal.

BRIEF DESCRIPTION OF THE DRAWINGS

FIG. 2 is a circuit diagram showing one embodiment of a decoder circuit according to this invention.

DESCRIPTION OF THE PREFERRED EMBODIMENT

A preferred embodiment of a decoder circuit according to this invention is illustrated in FIG. 2. This decoder circuit is featured by a MISFET Q25 connected between a MISFET Q21 acting as a load and 3 parallelly connected MISFETs Q22 to Q24 acting as drivers. Thus, a MISFET Q21 is of the depletion type with its drain terminal connected to a power supply Vcc and with its gate and source terminals commonly connected to a junction N21 acting as an output terminal of the circuit. Three MISFETs Q22, Q23 and Q24 are of the enhancement type with their drain terminals commonly connected to a junction N22 and with their source terminals grounded. Input logic signals A0, A1 and A2 from an address buffer circuit 51 are applied to respective gate terminals. A MISFET Q25 is also of the enhancement type with its drain terminal connected to the junction N21, its source terminal connected to the junction N22 and its gate terminal connected to receive a control signal $\phi 1$ from a control signal generator 52.

Figure 1:
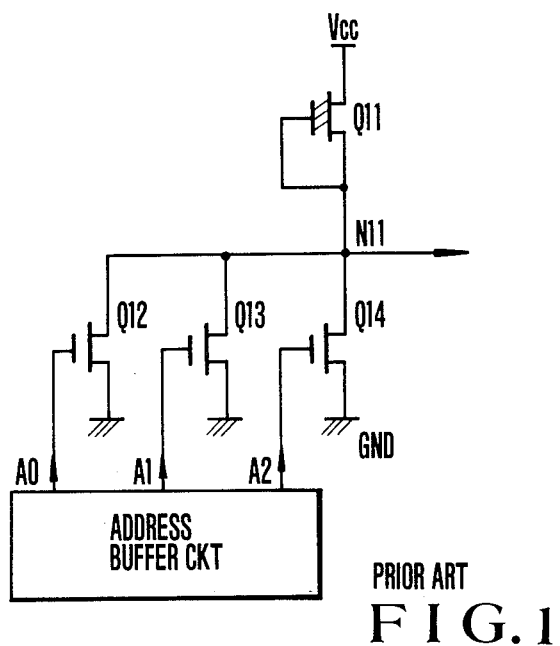
FIG. 1 is a circuit diagram showing one example of a prior art decoder circit.

This decoder circuit operates as follows:

Where the control signal $\phi 1$ is at a high level and at least one of the input logic signals A0 to A2 is at a high level, MISFET Q22, Q23 or Q24 supplied with the high input signal and the MISFET Q25 are rendered conductive so that the potential at the junction N21 can be made sufficiently low if the impedance ratio between the MISFET Q21 and the remainder of MISFETs Q25 and Q22 to Q24 is selected to be sufficiently large. Then, the decoder circuit assumes a non-selective state. Where all of the input signals A0 to A2 are at a low level, all the MISFETs Q22 to Q24 become non-conductive so that the ground current becomes zero with the result that the junction 21 assumes a high level and the decoder circuit assumes a selective state. Thus, the decoder circuit shown in FIG. 2 performs an ordinary decoder operation in accordance with the states of the input logic signals in the same manner as the prior art decoder circuit shown in FIG. 1.

Assume now that the control signal $\phi 1$ is at a low level. Then, the MISFET Q25 becomes non-conductive so that the ground current becomes zero irrespective of the states of the input logic signals A0 to A2. As a consequence, the junction N21 assumes the high level and the decoder circuit assumes the selective state. As described above, the decoder circuit of this invention not only performs an ordinary decoder operation but also assumes the selective state irrespective of the states of the input logic signals in accordance with the state of the control signal $\phi 1$.

A number of decoder circuits of this invention may be applied to a semiconductor memory device in such a manner that when all the decoder circuits are brought into the selective state, all memory cells are made active, thus making it possible to write in all the memory cells the same logic value of "1" or "0".

Figure 3:
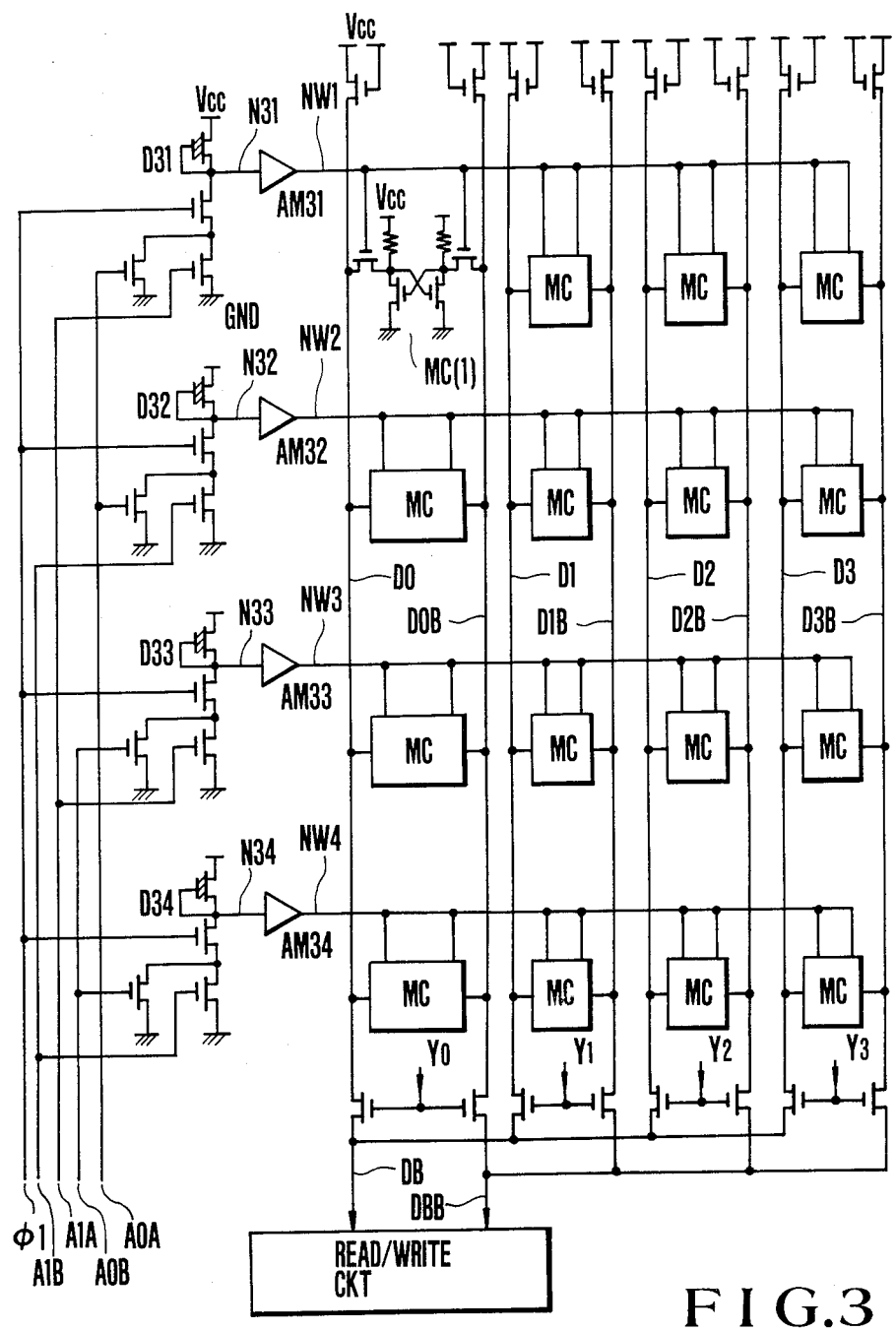
FIG. 3 is a connection diagram showing one example of the application of the decoder circuit embodying the invention.

FIG. 3 shows one example of such an application to a memory device having a memory of static type memory cells, decoder circuits and associated peripheral circuits. Particularly, the memory is exemplified as one including 4×4 memory cells MC. In FIG. 3, the decoder circuits of this invention are used as X-decoders D31 to D34 and amplifiers AM31 to AM34 amplify voltages at output junctions N31 to N34 of the X-decoders so as to drive word lines NW1 to NW4 at high speeds. Digit lines D0 to D3 and D0B to D3B are connectd to the cells and common data buses DB and DBB are connected to a read/write circuit. The digit lines and the data buses are interconnected through column selecting switching MISFETs. Logic signals A0A, A0B, A1A and A1B from an address buffer circuit are applied, as input logic signals, to the X-decoders. Input signals A0A and A0B, and A1A and A1B are complementary with each other. The control signal, $\phi 1$, is also fed to each of the X-decoders. Y-decoders and associated amplifiers (not shown) having the same construction as the X-decoders and their amplifiers produce logic signals Y1 to Y3.

In operation, when the control signal $\phi 1$ is at the high level, the circuit performs an ordinary memory operation. More particularly, in accordance with combinations of signals to the X- and Y-decoders, one X-decoder output and one Y-decoder output selectively become high, thereby accessing one memory cell on selected row and column. For example, in the X-decoders, when input signals A0A and A1A are at the low level (at this time the complementary input signals A0B and A1B are at the high level), only the X-decoder D31 is selected so that the word line NW1 becomes high. When the input signals A0A and A1B are at the low level, only the X-decoder D32 is selected so that the word line NW2 becomes high. The Y-decoders are controlled in the same manner. Thus, for example, where word line NW1 and Y-decoder output signal Y0 are selected, a memory cell MC(1) on the crosspoint can be accessed.

Then, when the control signal $\phi 1$ becomes low, all the decoders are brought into the selective state as has been described in connection with FIG. 2. Thus, all the word lines NW1 to NW4 assume the high level. In the same manner, all the output signals Y0 to Y3 of the Y-decoders become high, so that all the memory cells can be selected. Accordingly when a write signal is sent through the data buses DB and DBB from the read/write circuit, logic "0" or "1" can be written into all the cells in one cycle. A memory device having such performance can be used for picture image processing which requires a background (all "0" or "1").

In the foregoing, one embodiment of this invention has been described, but a power control switching circuit in the form of a MISFET may be added between the load MISFET Q21 and the power supply Vcc shown in FIG. 2. Thus, it should be understood that the invention is not limited to the circuit shown in FIG. 2 and that various additional circuits may be added.

Furthermore, although in the foregoing description, N-channel type MISFETs were used, P channel type MISFETs can also be used with the same advantageous effects.

What is claimed is:

1. A decoder circuit comprising a first voltage terminal, a second voltage terminal, and an output terminal; a first field effect transistor having a drain-source path coupled between said first voltage terminal and said output terminal, a second field effect transistor having one of a drain and a source coupled to said output terminal, a plurality of third field effect transistors having gates receiving input signals, drain-source paths of said third transistors being coupled between the other of the drain and source of said second transistor and second voltage terminal, control means for continuously rendering said second transistor conductive in a first operating mode and rendering said second transistor non-conductive in a second operation mode, and means for enabling said first transistor in both of said first and second operating modes, wherein a level of said output terminal is determined by said input signals in said first operating mode while a level of said output terminal is set at the level of said first voltage terminal irrespective of said input signals in said second operating mode.

2. The decoder circuit according to claim 1, wherein said first transistor is of a depletion type having a gate coupled to said output terminal.

3. A decoder circuit for a clearable RAM comprising a plurality of decoders for selecting a row or column of an array of memory cells, each decoder having a first MISFET constituting a load circuit connected between a power source terminal and an output terminal; a plurality of second MISFETS connected in parallel, either the sources or the drains of which are commonly connected to reference terminals and the others of which are commonly connected to a first junction point, and arranged to have input signals applied to the gate terminals; and a third MISFET having the drain-source path connected between said output terminal and first junction point and arranged to have a first control signal applied to the gate terminal, wherein one of the rows or columns is selected by an input signal from an address circuit when the third MISFETs are being turned on by the first control signal commonly transmitted to the decoders, and all of the rows and/or columns are selected when the third MISFETs are being turned off.

4. A decoder circuit according to claim 3, wherein said load circuit comprises a depletion-type MISFET wherein the drain terminal is connected to the power source terminal, and the source and gate terminals are commonly connected to the output terminal.

* * * * *